(12) United States Patent
Lee

(10) Patent No.: US 7,244,676 B2
(45) Date of Patent: Jul. 17, 2007

(54) METHOD FOR FABRICATING SEMICONDUCTOR DEVICE

(75) Inventor: Sung-Kwon Lee, Ichon-shi (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 665 days.

(21) Appl. No.: 10/609,519

(22) Filed: Jul. 1, 2003

(65) Prior Publication Data

US 2004/0126951 A1 Jul. 1, 2004

(30) Foreign Application Priority Data

Dec. 26, 2002 (KR) ............... 10-2002-0084144

(51) Int. Cl.
*H01L 21/44* (2006.01)

(52) U.S. Cl. ............... 438/672; 438/692; 257/E21.658
(58) Field of Classification Search ............... 438/233, 438/622, 626, 634, 671, 69, 637, 672, 692
See application file for complete search history.

(56) References Cited

U.S. PATENT DOCUMENTS 6,281,540 B1* 8/2001 Aoki .................... 257/306
6,716,766 B2* 4/2004 Ko ....................... 438/734

* cited by examiner

*Primary Examiner*—Quoc Hoang
(74) *Attorney, Agent, or Firm*—Lowe Hauptman & Berner LLP

(57) ABSTRACT

The present invention provides a method for fabricating a semiconductor device capable of securing a bottom contact area of a storage node contact as well as of preventing losses of a bit line hard mask insulation layer. These effects are achieved by planarizing an inter-layer insulation layer, which is filled into etched portions formed between conductive patterns, with the bit line hard mask insulation layer through a CMP process. This planarization process decreases a thickness of an etch target to thereby provide more vertical etch profile compared to a typical etch profile that is tapered or inclined at a bottom contact area. As a result of the decreased thickness of the etch target and the more vertical etch profile, it is possible to obtain the wider bottom contact area and prevent losses of the bit line hard mask insulation layer.

12 Claims, 12 Drawing Sheets

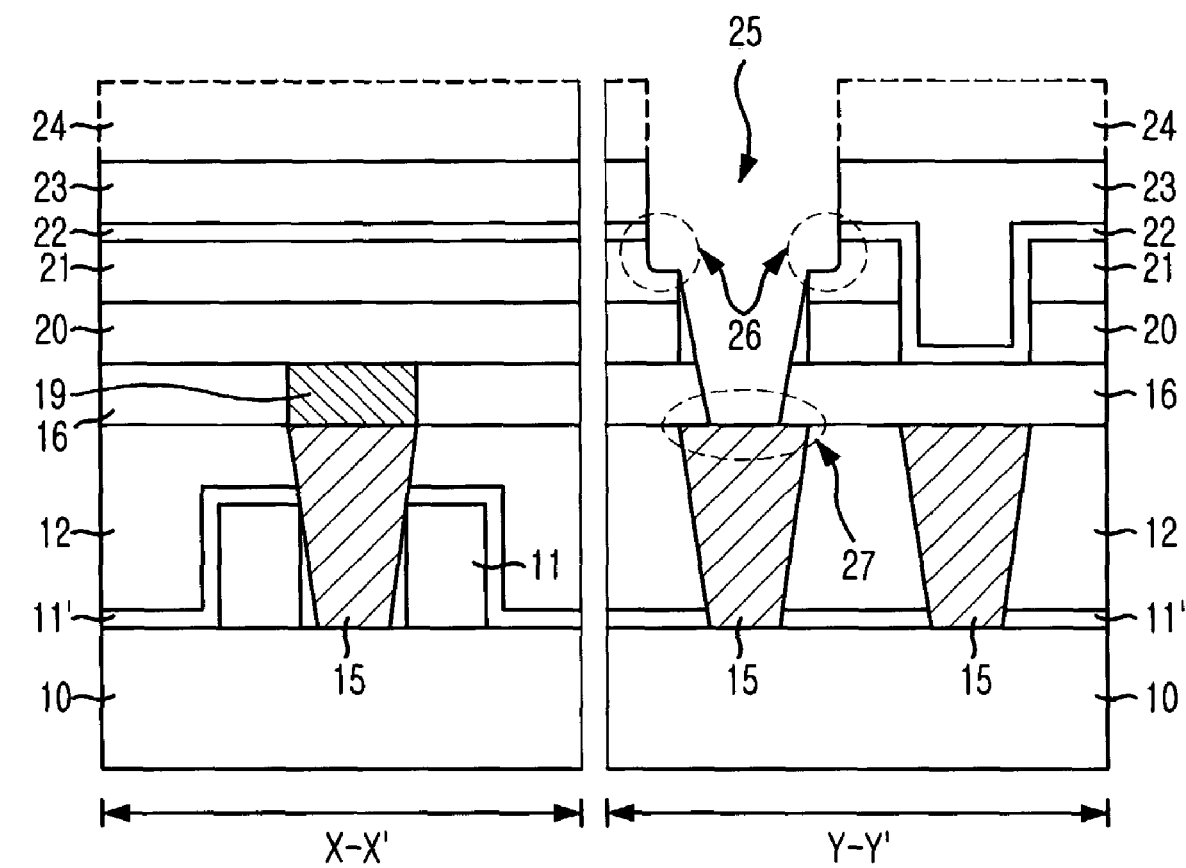

METHOD FOR FABRICATING SEMICONDUCTOR DEVICE

FIELD OF THE INVENTION

The present invention relates to a method for fabricating a semiconductor device; and, more particularly, to a method for fabricating a semiconductor device capable of increasing a contact area in a process for opening a storage node contact and of preventing losses of a bit line hard mask.

DESCRIPTION OF RELATED ARTS

There have been studied for various methods for achieving high-integration and high-speed in a semiconductor device. Among these methods, a method for securing a contact area when forming a contact is an essential one for achieving high-integration of the semiconductor device.

FIG. 1 is a plane view showing schematically a conductive pattern including a word line and a bit line.

As shown, a plurality of gate electrodes, e.g., a plurality of word lines W/L, are arrayed in one direction. A plurality of bit lines B/L are arrayed in a direction of crossing the word lines W/L. Particularly, each of the bit lines B/L is contacted to each corresponding active region (not shown) formed in a substrate through a bit line contact. At this time, a landing plug contact process, i.e., a LPC1 process, is employed to form a group of plugs for these contacts. Also, from the LPC1 process, a group of plugs for making contacts with a plurality of storage node contacts (SNC) are formed.

FIGS. 2A to 2G are cross-sectional views taken in directions of X–X' and Y–Y' lines of FIG. 1. With reference to FIGS. 2A to 2G, a typical semiconductor fabrication process will be explained in the following.

Referring to FIG. 2A, a gate electrode 11 is formed on a substrate 10 on which several elements for fabricating a semiconductor device are formed.

In more detail, the gate electrode 11 is made of a single or stack layer of tungsten or polysilicon. A gate insulation layer (not shown) is formed on an interface between the gate electrode 11 and the substrate 10. On top of the gate electrode 11, an oxide-based inter-layer insulation layer and a nitride-based hard mask (both not shown) are formed in order to protect the gate electrode 11 during a subsequent self-aligned contact (SAC) process and obtain a good SAC profile. Herein, the nitride-based hard mask has a predetermined etch selectivity ratio.

An ion-implantation technique is applied to a portion of the substrate 10 disposed between the gate electrodes 11 to form impurity contact regions such like source/drains, i.e., active regions (not shown).

A nitride-based gate etch stop layer 11' is formed to encompass sidewalls of the gate electrode 11.

As shown in FIG. 2B, a first inter-layer insulation layer 12 of which top surface is planarized is formed on the above entire structure including the gate electrode 11 through the use of a typical oxide-based layer or a flowable oxide layer. An anti-reflection layer (not shown) is subsequently formed thereon. Particularly, the anti-reflection layer is made of an organic material. A photoresist is coated on the anti-reflection layer and is patterned by employing a photo-exposure process using a KrF or ArF light source so as to form a first photoresist pattern 13 for forming a landing plug contact (LPC)

In more detail of the above first photoresist pattern 13 formation, the photoresist is coated on the anti-reflection layer until reaching a predetermined thickness. An additional process such as an electron beam examination or an Ar ion-implantation is carried out to reinforce tolerance of the first photoresist pattern 13 to a subsequent etch process. Afterwards, the ArF light source (not shown) and a predetermined reticle (not shown) are used to selectively photo-expose a preset portion of the photoresist. Subsequent to the photo-exposure process, a developing process is performed to make a photo-exposed portion by the photo-exposure process or a non-photo-exposed portion remain, and a cleaning process is initiated to remove etch remnants. From these processes, the first photoresist pattern 13 is formed.

Next, the first inter-layer insulation layer 12 is selectively etched by using the first photoresist pattern 13 as an etch mask, and a SAC technique for forming a contact hole 14 exposing a surface of the substrate 10, i.e., a LPC1 process, is then performed.

Subsequently, the first photoresist pattern 13 is removed through a Photoresist strip process, and a cleaning process is performed to remove etch remnants remaining within the contact hole 14. Referring to FIG. 2C, a polysilicon deposition or a selective epitaxial growth (SEG) technique is used to fill a conductive plug material into the contact hole 14, and a chemical mechanical polishing (CMP) process or a blanket-etch process is employed to thereby form a plurality of isolated plugs 15.

Referring to FIG. 2D, a second inter-layer insulation layer 16 is formed and a second photoresist pattern 17 for defining a bit line contact is formed thereon. Then, the second inter-layer insulation layer 16 is selectively etched with use of the second photoresist pattern 17 as an etch mask so as to form a bit line contact hole 18 opening a surface of the correspondent plug 15.

Referring to FIG. 2E, a bit line contact plug 19 contacted to the surface of the opened plug 15 is formed. A conductive layer 20 for a bit line (hereinafter referred to as a bit line conductive layer) and a nitride-based insulation layer 21 for a bit line hard mask (hereinafter referred to as a bit line hard mask insulation layer) are deposited thereafter. Herein, the bit line conductive layer 20 is a single or stack layer of tungsten, tungsten nitride, polycide or polysilicon.

Then, a third photoresist pattern (not shown) for forming a bit line pattern is formed and is used as an etch mask when etching the bit line hard mask insulation layer 21 and the bit line conductive layer 20. From this etch process, a bit line having a stack structure including the bit line conductive layer 20 and the bit line hard mask insulation layer 21 is formed.

Referring to FIG. 2F, a nitride-based etch stop layer 22 is deposited along a profile including the bit line in order to prevent an attack to the bit line during a subsequent etch process for forming a storage node contact.

Next, an oxide-based third insulation layer 23 is deposited on the above entire structure. A forth photoresist pattern 24 is formed thereon. Herein, the forth photoresist pattern 24 is for forming a storage node contact hole by opening each surface of a group of the plugs 15 for storage node contacts.

Referring to FIG. 2G, the third inter-layer insulation layer 23, the etch stop layer 22 and the second inter-layer insulation layer 16 are sequentially etched by using the photoresist pattern 24 as an etch mask so as to form an opening, that is, a storage node contact hole 25.

Meanwhile, during this etch process, the etch target including the third inter-layer insulation layer 23, the etch stop layer 22 and the second inter-layer insulation layer 16 is excessively etched compared to an etch target used in a typical SAC etch process. As a result of this excessive etching, there occurs a loss of the bit line hard mask insulation layer 21. This loss is denoted as the reference number 26 in FIG. 2G.

In addition, an inclined etch profile appears at sidewalls of the storage node contact hole 25 due to this excessive etching. Therefore, a bottom portion of the storage node contact hole 25 has a decreased contact area, and this effect is denoted as the reference numeral 27 in FIG. 2G.

Accordingly, a contact resistance is increased since a contact area between the plug 15 and a subsequent storage node contact pad is decreased. This increase in the contact resistance of such storage node eventually results in degradation of an overall electric property of a semiconductor device.

Meanwhile, in case of the LPC2 process for forming the storage node contact, an etch profile of the storage node contact hole 25 is tapered or inclined in a direction toward a bottom side of the storage node contact hole. Thus, in addition to the typical SAC process during the LPC2 process, a wet etching process is performed to block the increase of the contact resistance. However, this approach employed for securing a contact area, i.e., a critical dimension, is not a fundamental solution since it increases a probability of an attack to the first inter-layer insulation layer 12.

SUMMARY OF THE INVENTION

It is, therefore, an object of the present invention to provide a method for fabricating a semiconductor device capable of securing a sufficient bottom contact area of a storage node contact as well as of preventing losses of a bit line hard mask insulation layer.

In accordance with an aspect of the present invention, there is provided a method for fabricating a semiconductor device, including the steps of: (a) forming a plurality of plugs contacted to a substrate by passing through a first inter-layer insulation layer; (b) forming a second inter-layer insulation layer on an entire surface of the substrate structure resulted from the step (a); (c) forming a conductive layer being contacted to a first group of the plugs by passing through the second inter-layer insulation layer; (d) forming a hard mask insulation layer on the conductive layer; (e) forming a conductive pattern by selectively etching the conductive layer and the hard mask insulation layer until a surface of the second inter-layer insulation layer is exposed; (f) forming a third inter-layer insulation layer on the entire resulting structure from the step (e); (g) performing a chemical mechanical polishing process to get the third inter-layer insulation layer planarized with the hard mask insulation layer; and (h) etching selectively the third inter-layer insulation layer and the second inter-layer insulation layer to form a contact hole exposing each surface of a second group of the plugs.

BRIEF DESCRIPTION OF THE DRAWING(S)

The above and other objects and features of the present invention will become apparent from the following description of the preferred embodiments given in conjunction with the accompanying drawings, in which:

FIGS. 2A to 2G are cross-sectional views explaining a conventional method for fabricating a semiconductor device;

DETAILED DESCRIPTION OF THE INVENTION

Figure 1:
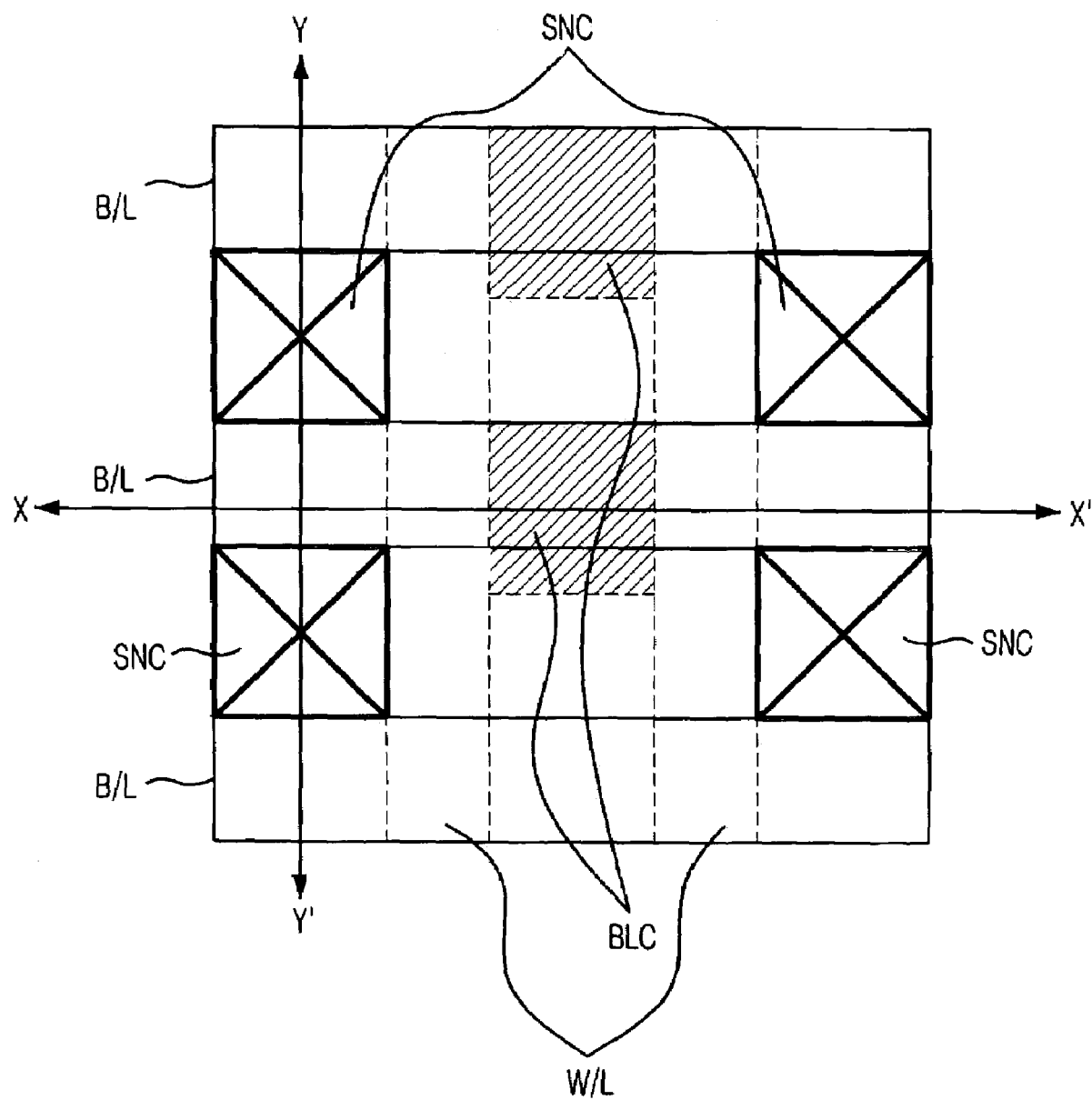
FIG. 1 is a plane view schematically showing a conductive pattern including word lines and bit lines.
Figure 2A:
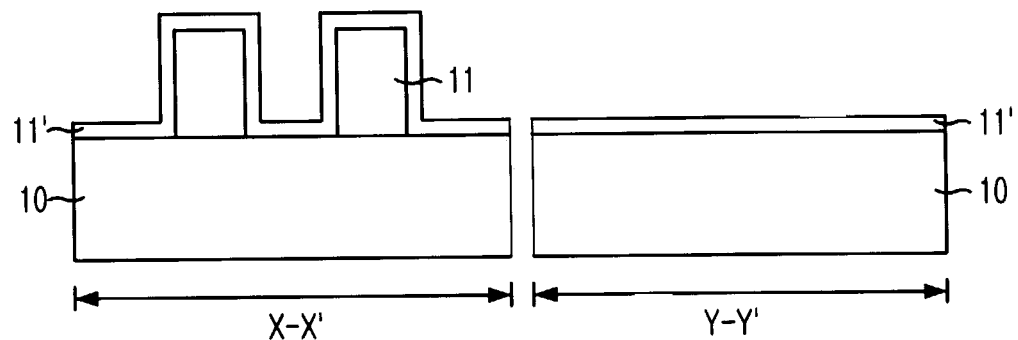
Figure 2B:
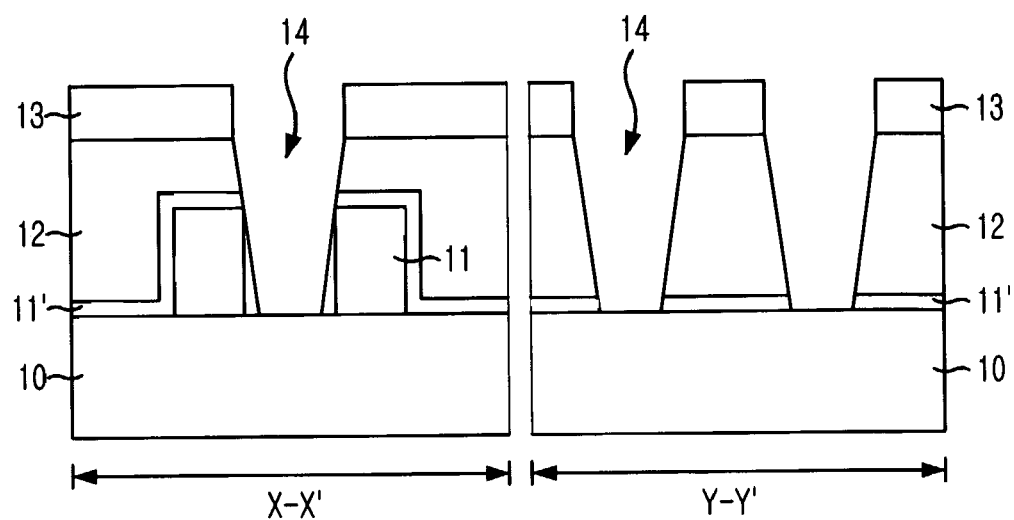
Figure 2C:
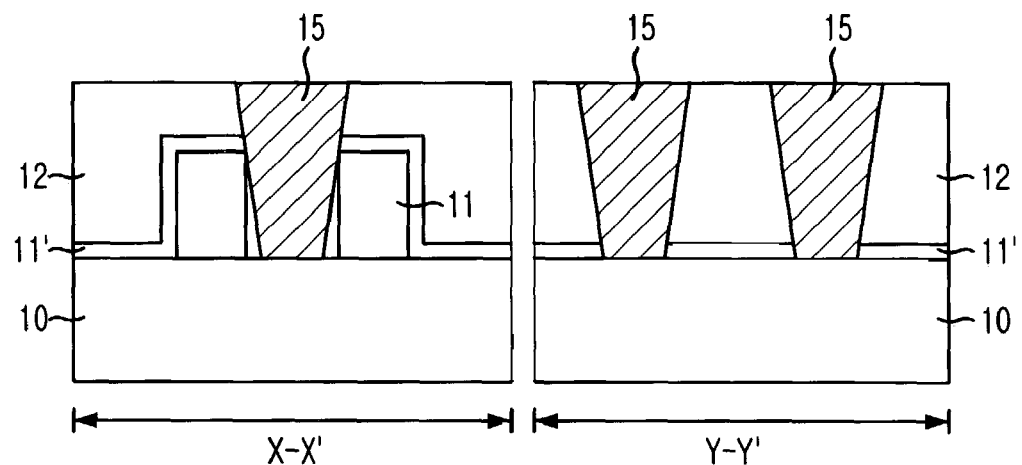
Figure 2D:
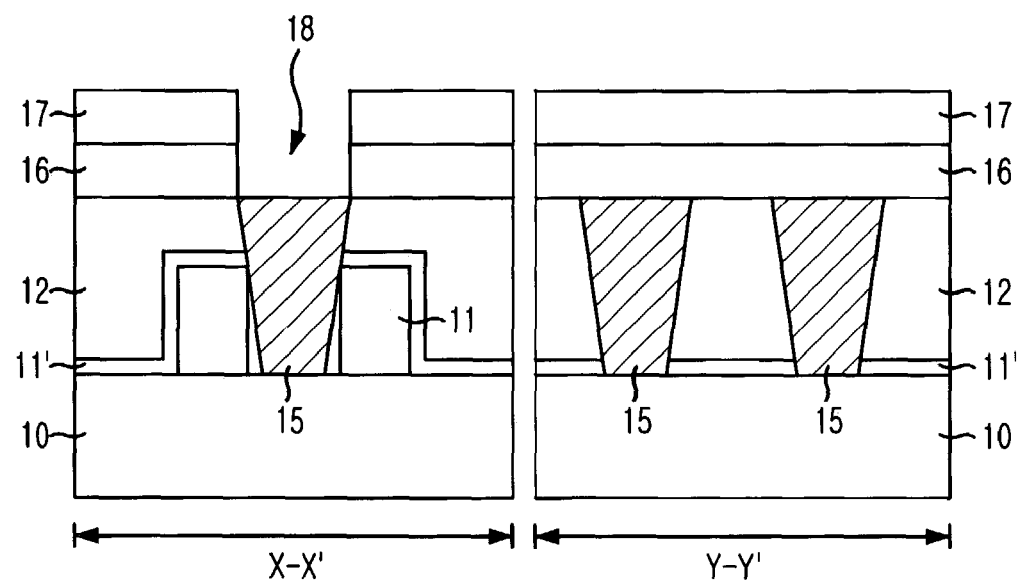
Figure 2E:
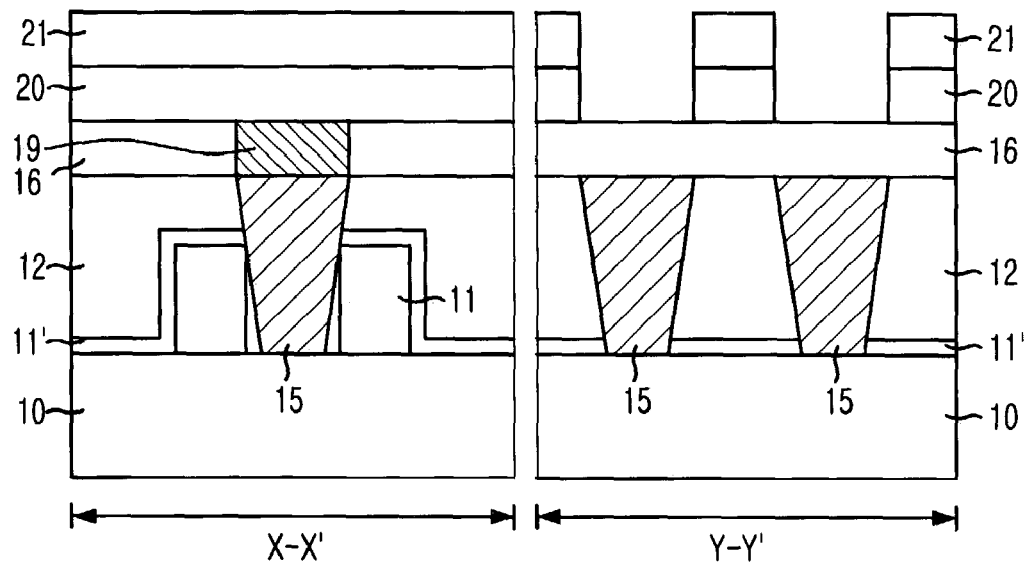
Figure 2F:
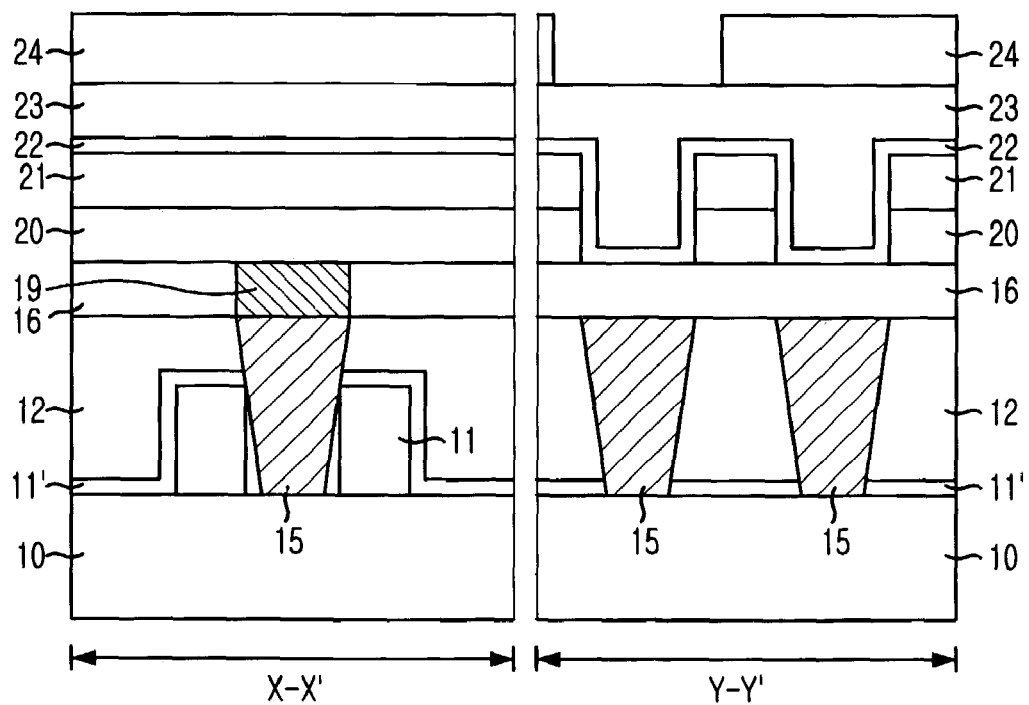

Among the drawings related to the prior art, that are, FIG. 1 and FIGS. 2A to 2G, the same drawings are used if the processes and constitution elements are identically used in the preferred embodiments of the present invention for the sake of convenience. Also, the same reference numerals are used for the same constitution elements in the preferred embodiments.

Figure 3:
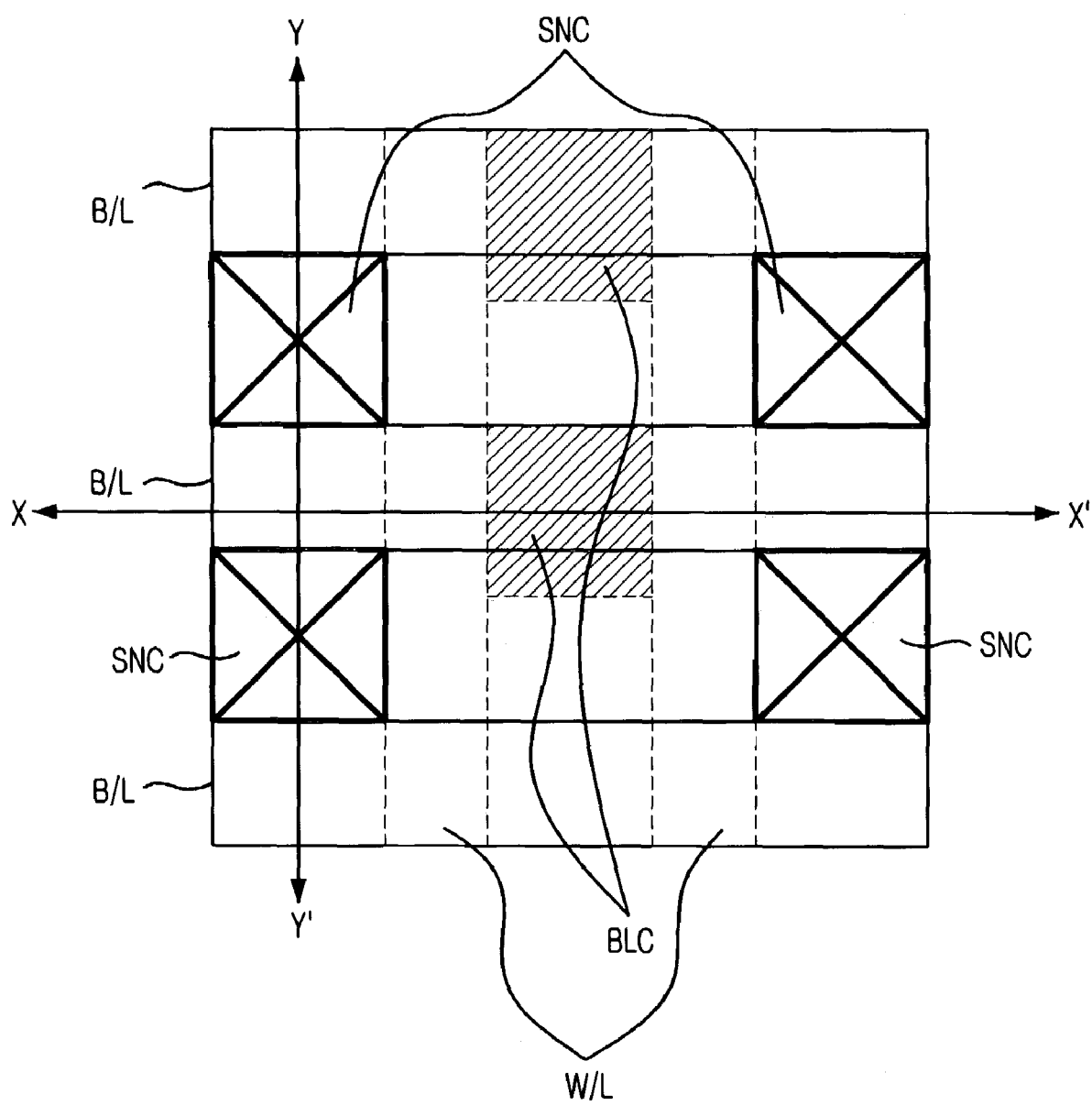
FIG. 3 is a plane view schematically showing a conductive pattern including word lines and bit lines in accordance with the present invention.

FIG. 3 is a plane view showing schematically a conductive pattern including a word line and a bit line according to the present invention.

As shown, a plurality of gate electrodes, e.g., a plurality of word lines W/L, are arrayed in one direction. A plurality of bit lines B/L are arrayed in a direction of crossing the word lines W/L. Particularly, each of the bit lines B/L is contacted to each corresponding active region (not shown) formed in a substrate through a bit line contact. At this time, a landing plug contact process, i.e., a LPC1 process, is employed to form a group of plugs for these contacts. Also, from the LPC1 process, a group of plugs for making contacts with a plurality of storage node contacts (SNC) are formed.

FIGS. 4A to 4G are cross-sectional views taken in directions of the lines X–X' and Y–Y' of FIG. 3. With reference to FIGS. 4A to 4G, a semiconductor fabrication process will be explained in the following.

As shown, a gate electrode 11 is formed on a substrate 10 providing constitution elements of a semiconductor device.

In more detail, the gate electrode 11 is made of a single or stack layer of tungsten or polysilicon. A gate insulation layer (not shown) is formed on an interface between the gate electrode 11 and the substrate 10. On top of the gate electrode 11, an oxide-based inter-layer insulation layer and a nitride-based hard mask (both not shown) are formed in order to protect the gate electrode 11 during a subsequent self-aligned contact (SAC) process and obtain a good SAC profile. Herein, the nitride-based hard mask has a predetermined etch selectivity ratio.

An ion-implantation technique is applied to a portion of the substrate 10 disposed between the gate electrodes 11 to form a plurality of an impurity contact regions such like source/drains, i.e., active regions (not shown).

A nitride-based gate etch stop layer 11' is formed to encompass sidewalls of the gate electrode 11.

Figure 4A:
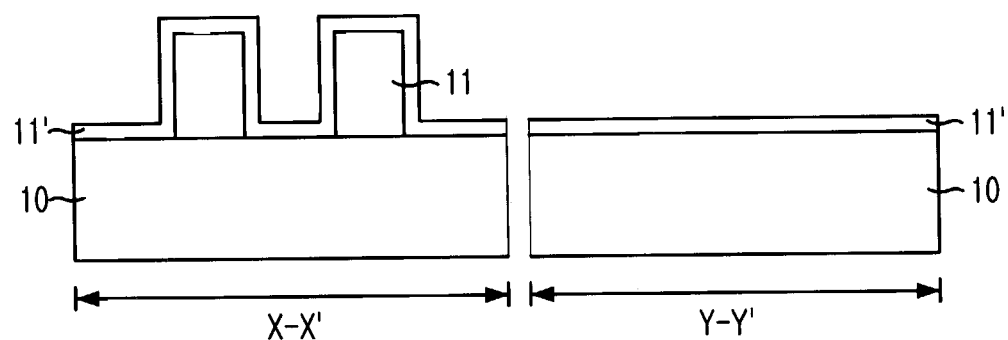
FIGS. 4A and 4G are cross-sectional views illustrating a method for fabricating a semiconductor device in accordance with a first preferred embodiment of the present invention.
Figure 4B:
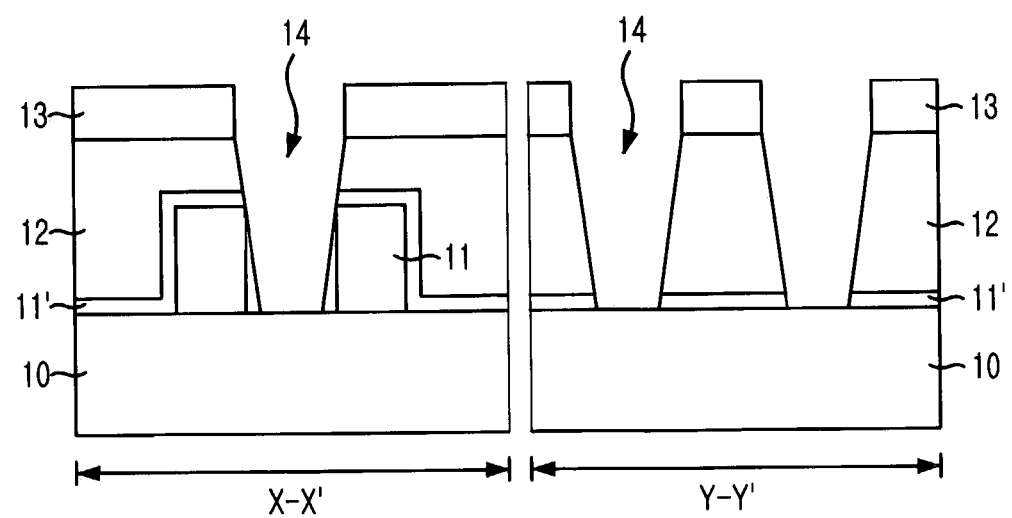

As shown in FIG. 4B, a first inter-layer insulation layer 12 of which top surface is planarized is formed on the above entire structure including the gate electrode 11 through the use of a typical oxide-based layer or a flowable oxide layer. An anti-reflection layer (not shown) is subsequently formed thereon. Particularly, the anti-reflection layer is made of an organic material. A photoresist is coated on the anti-reflection layer and is patterned by employing a photo exposure process using a KrF or ArF light source so as to form a first photoresist pattern 13 for forming a landing plug contact (LPC).

In more detail of the above first photoresist pattern 13 formation, the photoresist is coated on the anti-reflection layer until reaching a predetermined thickness. An additional process such as an electron beam examination or an Ar ion-implantation is carried out to reinforce tolerance of the first photoresist pattern 13 to a subsequent etch process. Afterwards, the ArF light source (not shown) and a predetermined reticle (not shown) are used to selectively photo-expose a preset portion of the photoresist. Subsequent to the photo-exposure process, a developing process is performed to make a photo-exposed portion by the photo-exposure process or a non-photo-exposed portion remain, and a cleaning process is initiated to remove etch remnants. From these processes, the first photoresist pattern 13 is formed.

Next, the first inter-layer insulation layer 12 is selectively etched by using the first photoresist pattern 13 as an etch mask, and a SAC, technique for forming a contact hole 14 exposing a surface of the substrate 10, i.e., a LPC1 process, is then performed.

Figure 4C:
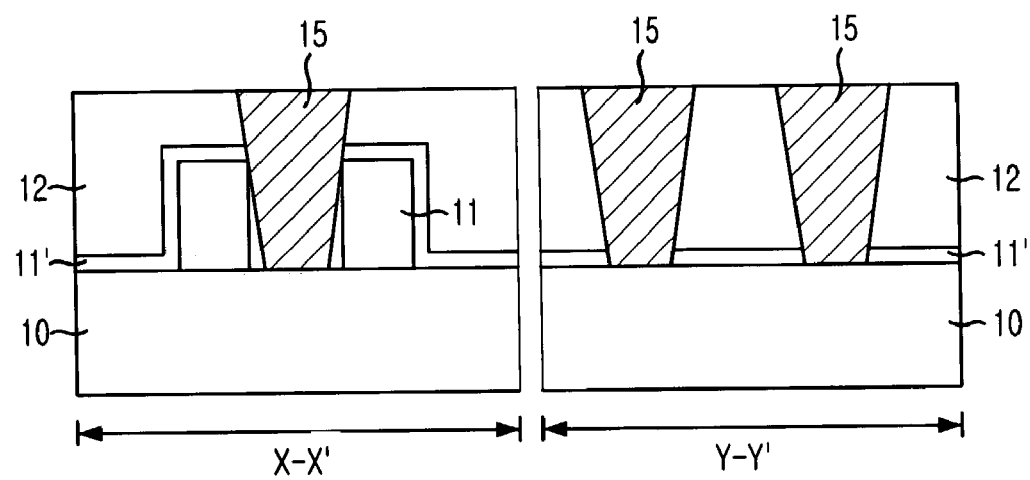

Subsequently, the first photoresist pattern 13 is removed through a Photoresist strip process, and a cleaning process is performed to remove etch remnants remaining within the contact hole 14. Referring to FIG. 4C, a polysilicon deposition or a selective epitaxial growth (SEG) technique is used to fill a conductive plug material into the contact hole 14, and a chemical mechanical polishing (CMP) process or a blanket-etch process is employed to thereby form a plurality of isolated plugs 15.

Figure 4D:
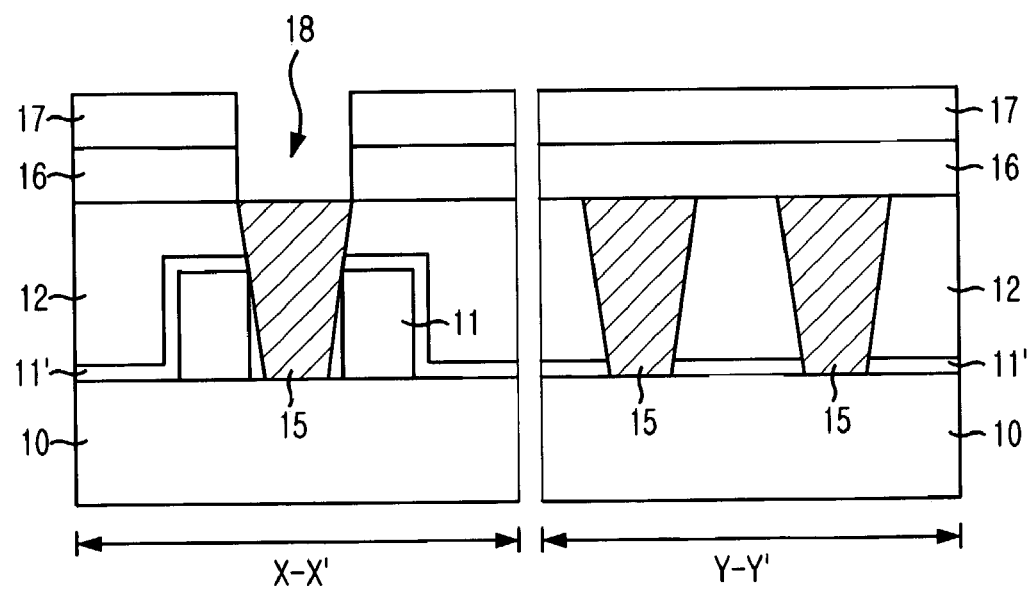

Referring to FIG. 4D, a second inter-layer insulation layer 16 is formed, and a second photoresist pattern 17 for defining a bit line contact is formed thereon. Then, the second inter-layer insulation layer 16 is selectively etched with use of the second photoresist pattern 17 as an etch mask so as to form a bit line contact hole 18 opening a surface of the correspondent plug 15.

Figure 4E:
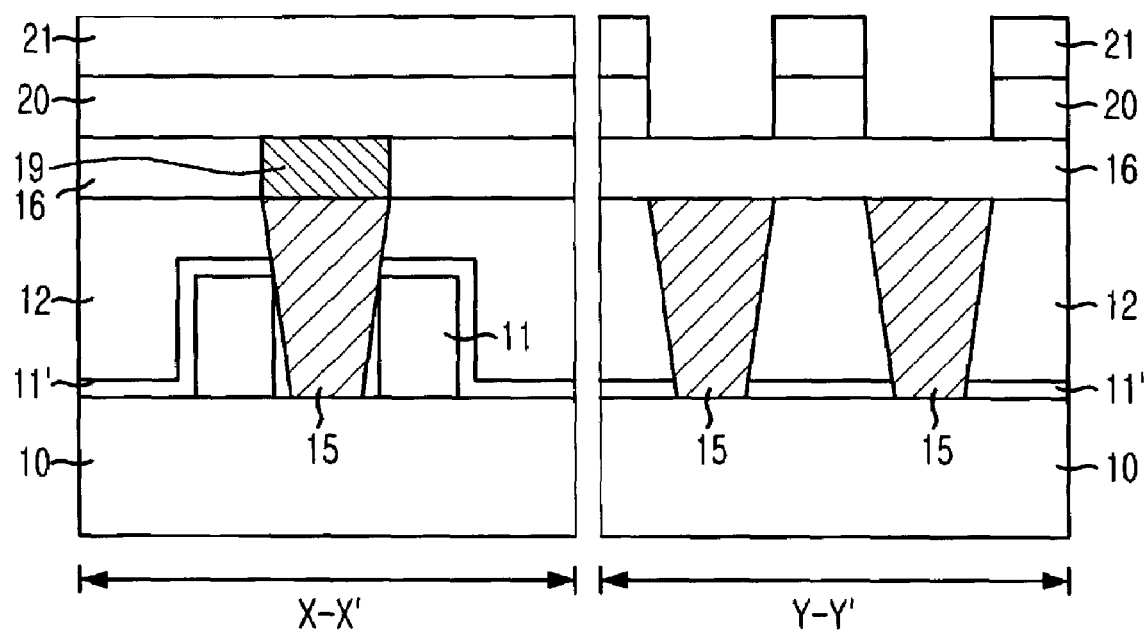

Referring FIG. 4E, a bit line contact plug 19 contacted to the surface of the opened plug 15 is formed. A conductive layer 20 for a bit line (hereinafter referred to as a bit line conductive layer) and a nitride-based insulation layer 21 for a bit line hard mask (hereinafter referred to as a bit line hard mask insulation layer) are deposited thereafter. Herein, the bit line conductive layer 20 is a single or stack layer of tungsten, tungsten nitride, polycide or polysilicon.

Then, a third photoresist pattern (not shown) for forming bit line patterns is formed and used as an etch mask when the bit line hard mask insulation layer 21 and the bit line conductive layer 20 are etched. From this etch process, each bit line having a stack structure including the bit line conductive layer 20 and the bit line hard mask insulation layer 21 is formed.

Next, a nitride-based etch stop layer 22 is deposited along a profile including the bit line in order to prevent the bit line from being attacked during a subsequent etch process for forming a storage node contact.

Figure 4F:
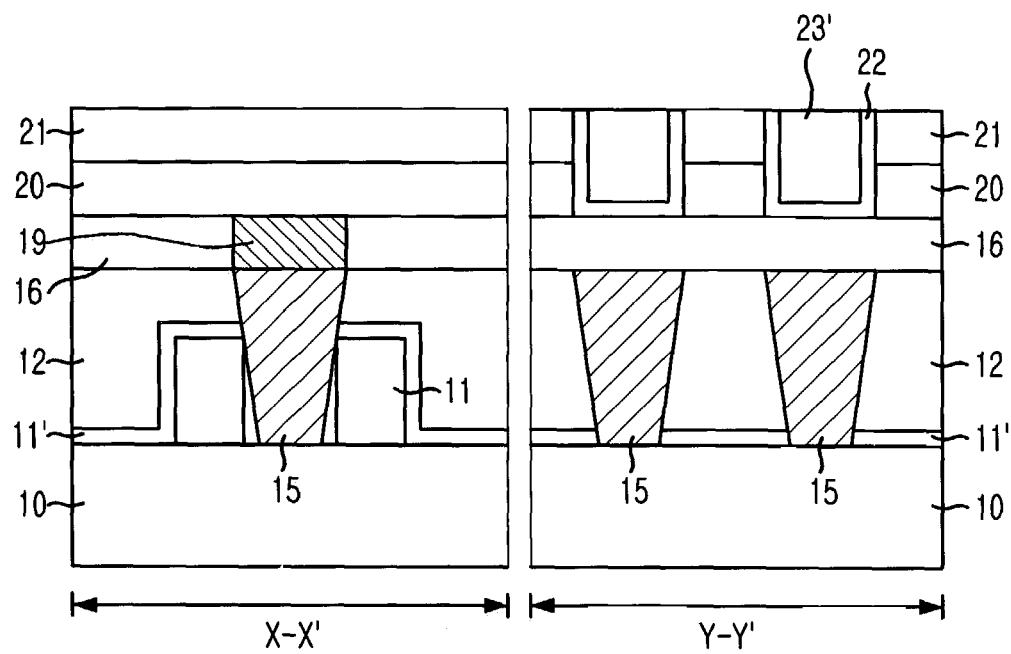

Referring to FIG. 4F, an oxide-based third inter-layer insulation layer 23' is deposited on the above structure, and a CMP process is performed to expose a surface of the bit line hard mask insulation layer 21 so that the third inter-layer insulation layer 23' is buried in etched portions formed between the bit lines and is then planarized.

Therefore, according to the prior art, the third inter-layer insulation layer 23' remains on a top portion of the bit line hard mask insulation layer 21 during an etch process for forming a storage node contact and this remnant becomes a factor for increasing a thickness of the total etch target. However, in accordance with the present invention, the thickness of the total etch target decreases since the third inter-layer insulation layer 23' does not remain on the bit line hard mask insulation layer 21.

Figure 4G:
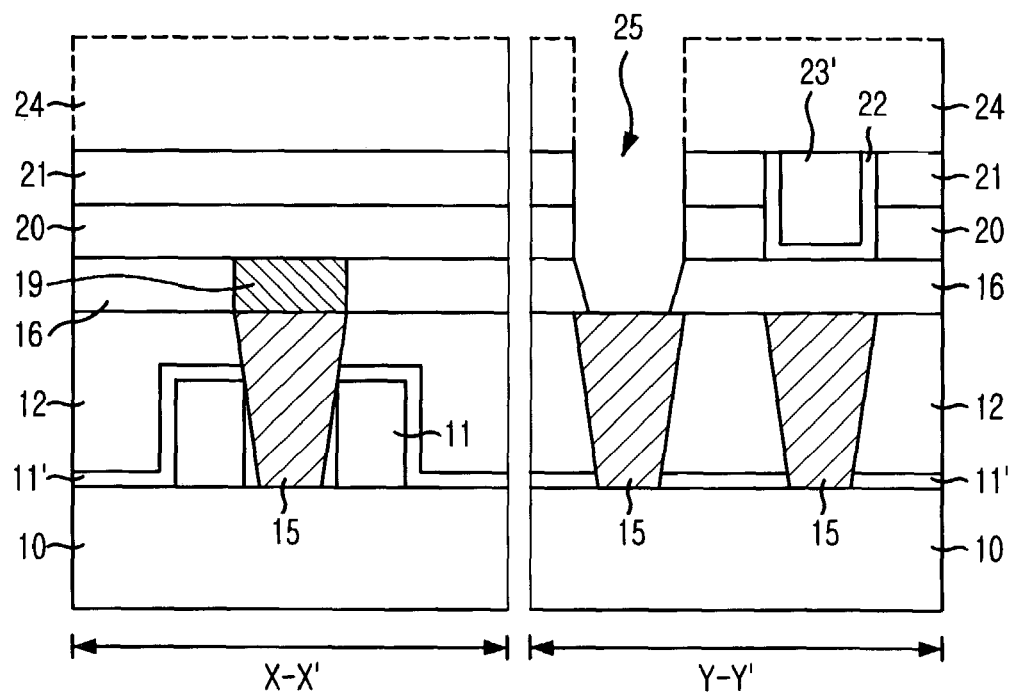

As shown in FIG. 4G, a forth photoresist pattern 24 is formed on the above resulting structure. Herein, the forth photoresist pattern 24 is for forming storage node contact holes by opening each surface of a group of the plugs 15 for storage node contacts formed by the LPC1 process.

Next, the third inter-layer insulation layer 23', the etch stop layer 22 and the second inter-layer insulation layer 16 are sequentially etched by using the photoresist pattern 24 as an etch mask so as to form an opening, that is, a storage node contact hole 25. Herein, a mask for forming a storage node contact (hereinafter referred to as a storage node contact mask) can be formed in a T-type, a hole-type or a line-type.

The above etch process is a dry etching process with the application of a typical SAC process recipe. In order for the oxide-based inter-layer insulation layer, the nitride-based etch stop layer and the bit line hard mask insulation layer have high selectivity ratio values, such gas as $C_3F_8$, $C_4F_8$, $C_5F_8$, $C_4F_6$, $C_3F_3$ and $C_2F_4$ are used as an etch gas. As shown, this etch gas contains carbons inducing lots of polymers.

Also, such gas as $CHF_3$, $C_2HF_5$, $CH_2F_2$ or $CH_3F$ can be can be also used as the etch gas for increasing a bottom side area of a contact hole in order to improve reliability of the etch process along with the high etch selectivity.

Such inert gas as He, Ne, Ar, Kr or Xe can be also used as the etch gas for improving a stopping function of the etch process by increasing plasma stability and sputtering efficiency.

Meanwhile, it is also possible to use a combined gas of the above gases. Such compound like $C_xH_yF_z$ where x, y and z is equal to or greater than 2, can be added to the etch gas containing carbons that induces lots of polymers to provide the etch process capable of increasing the bottom side area of the contact hole.

Eventually, when the storage node contact hole 25 is formed, the thickness of the etch target according to the present invention decreases due to the third inter-layer insulation layer 23', and thus, the number of etch gases and a period of performing the etch process can be reduced. Accordingly, it is possible to prevent losses of the bit line hard mask insulation layer 21.

Furthermore, compared to the typical SAC etch process providing an inclined etch profile at sidewalls of the storage node contact hole 25 due to an excessive etch, the present invention provides an etch profile that is more vertical. As a result of this improved etch profile, the decrease of the bottom side area of the storage node contact hole 25 can be minimized.

Therefore, a contact area between a subsequent storage node contact pad and the plug 15 is increased, and this fact further results in a decreased contact resistance.

Figure 5A:
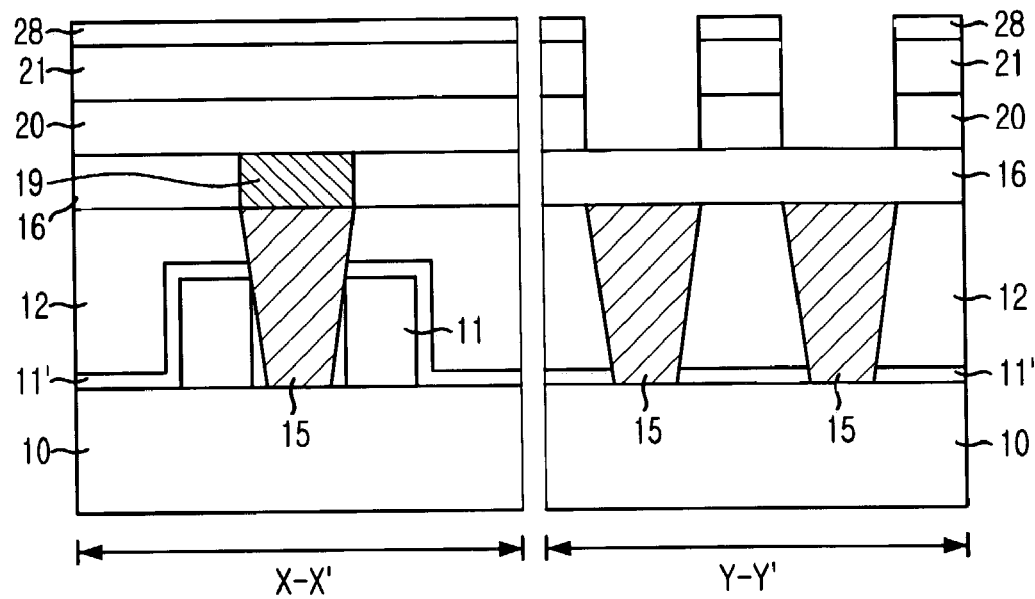
FIGS. 5A and 5C are cross-sectional views depicting a second preferred embodiment of the present invention.
Figure 5B:
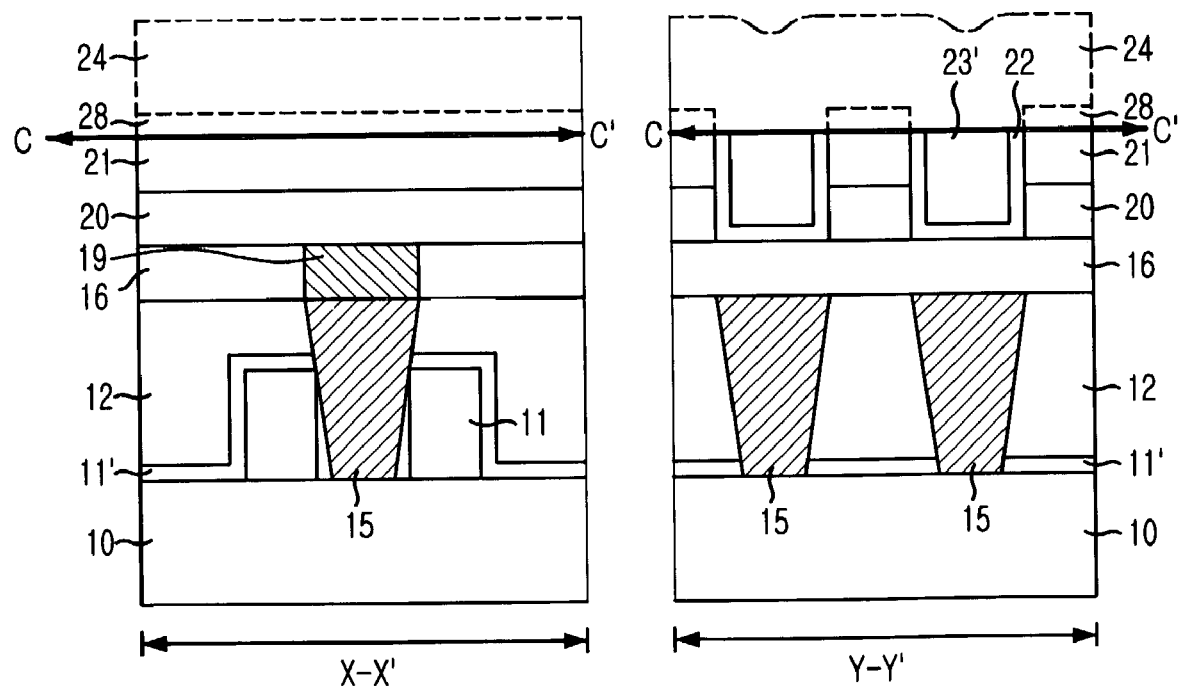
Figure 5C:
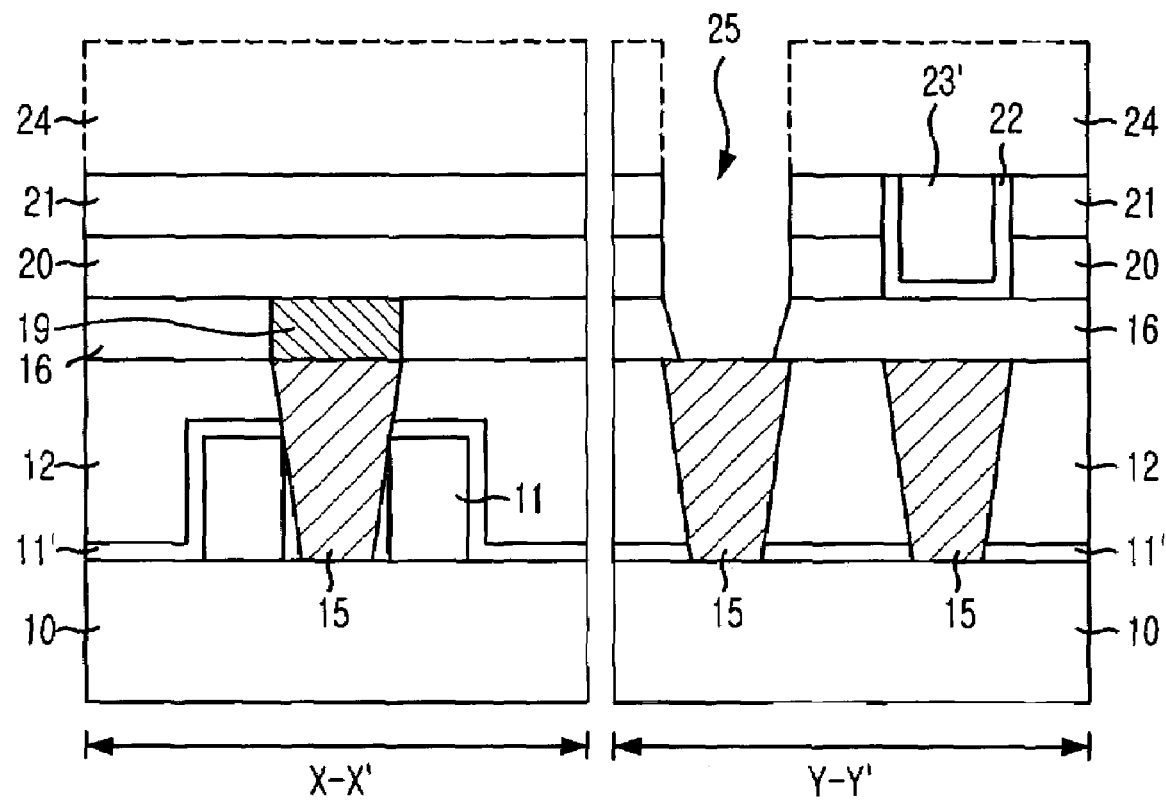

FIGS. 5A and 5C are cross-sectional views showing a method for fabricating a semiconductor device in accordance with a second preferred embodiment of the present invention.

If constitution elements of the second preferred embodiment are identical to those of the first preferred embodiments, the same reference numerals are used and detailed descriptions on those elements are omitted.

FIG. 5A is a cross-sectional view showing a bit line including a metal sacrificial layer 28. As shown in FIG. 5A, this second preferred embodiment is different from the first preferred embodiment that the metal sacrificial layer 28 is additionally formed on the hard mask insulation layer 21.

While the third inter-layer insulation layer 23' is planarized in a subsequent CMP process, the additional, sacrificial layer 28 acts as a sort of the etch stop layer so that the bit line is protected during an etch process performed until a surface of the second inter-layer insulation layer 16 is exposed. Herein, the metal sacrificial layer 28 preferably uses tungsten, tungsten silicide, titanium nitride or tungsten nitride.

Next, the etch stop layer 22 is deposited along a profile containing the bit line. Then, the third inter-layer insulation layer 23' are deposited on the above entire structure, and a CMP process is then performed to make the third inter-layer insulation layer 23' buried into etched portions formed between the bit lines.

After the CMP process, the same subsequent processes are performed. FIG. 5C shows the semiconductor device completed with this series of processes.

The preferred embodiments of the present invention shows that the storage node contact hole is formed by etching the insulation layer buried into the etched portions formed between the bit lines. However, it is still possible to etch the insulation layer allocated between the gate electrodes.

Also, the preferred embodiments of the present invention provides effects of preventing losses of the bit line hard mask insulation layer during the contact hole formation by decreasing the thickness of the total etch target in the etch process for forming the storage node contact hole. The thickness of the total etch target is decreased by planarizing the third inter-layer insulation layer, i.e., the bit line insulation layer, together with the bit line hard mask insulation layer. Also, it is shown that the etch profile of the storage node contact hole is more vertical, thereby securing sufficiently a critical dimension of the bottom side of the storage node contact hole. As a result of these effects, it is possible to increase semiconductor device yields.

While the present invention has been described with respect to certain preferred embodiments, it will be apparent to those skilled in the art that various changes and modifications may be made without departing from the scope of the invention as defined in the following claims.

What is claimed is:

1. A method for fabricating a semiconductor device, comprising the steps of:
   (a) forming a plurality of plugs contacted to a substrate by passing through a first inter-layer insulation layer;
   (b) forming a second inter-layer insulation layer on an entire surface of the substrate structure resulted from the step (a);
   (c) forming a conductive layer being contacted to a first group of the plugs by passing through the second inter-layer insulation layer;
   (d) forming a hard mask insulation layer on the conductive layer;
   (e) forming a metal sacrificial layer deposited on the hard mask insulation layer;
   (f) forming a conductive pattern by selectively etching the conductive layer, the hard mask insulation layer and the metal sacrificial layer until a surface of the second inter-layer insulation layer is exposed;
   (g) forming a third inter-layer insulation layer on the entire resulting structure from the step (f);
   (h) performing a chemical mechanical polishing process to get an upper surface of the third inter-layer insulation layer planarized with the an upper surface of hard mask insulation layer; and
   (i) etching selectively the third inter-layer insulation layer and the second inter-layer insulation layer to form a contact hole exposing each surface of a second group of the plugs.

2. The method as recited in claim 1, wherein the conductive pattern is a bit line.

3. The method as recited in claim 1, wherein the contact hole is a storage node contact hole.

4. The method as recited in claim 3, wherein the storage node contact hole is formed by a self-aligned contact (SAC) process employing a dry etching process.

5. The method as recited in claim 4, wherein such gas as $C_3F_8$, $C_4F_8$, $C_5F_8$, $C_3F_3$, $C_4F_6$ or $C_2F_4$ is used as a main etch gas to provide high etch selectivity during the SAC process.

6. The method as recited in claim 4, wherein during the SAC process, such gas as $CHF_3$, $C_2HF_5$, $CH_2F_2$ or $CH_3F$ can be can be also used as the etch gas for increasing a bottom side area of the contact hole in order to improve reliability of the etch process along with the high etch selectivity.

7. The method as recited in claim 4, wherein during the SAC process, oxygen gas or an inert gas such as He, Ne, Ar, Kr or Xe can be also used as the etch gas for improving a stopping function of the etch process by increasing plasma stability and sputtering efficiency.

8. The method as recited in claim 4, wherein a mask for forming the storage node contact hole is formed in a hole-type, T-type or a line-type.

9. The method as recited in claim 1, wherein the hard mask insulation layer is a nitride-based layer and the first to the third inter-layer insulation layers are oxide-based layers.

10. The method as recited in claim 1, wherein the metal sacrificial layer prevents losses of the hard mask insulation layer during the CMP process.

11. The method as recited in claim 1, wherein the metal sacrificial layer includes a material selected from a group consisting of tungsten, tungsten nitride, titanium nitride and tungsten silicide.

12. The method as recited in claim 1, wherein the conductive pattern is formed with use of a photoresist pattern formed by employing a photo-exposure process using a light source of KrF or ArF.

* * * * *